(12) United States Patent
Wen

(10) Patent No.: US 10,283,389 B2
(45) Date of Patent: *May 7, 2019

(54) ADJUSTABLE SEMICONDUCTOR PROCESSING DEVICE AND CONTROL METHOD THEREOF

(75) Inventor: Sophia Wen, Wuxi (CN)

(73) Assignee: WUXI HUAYING MICROELECTRONICS TECHNOLOGY CO., LTD, Wuxi (CN)

(*) Notice: Subject to any disclaimer, the term of this patent is extended or adjusted under 35 U.S.C. 154(b) by 49 days.

This patent is subject to a terminal disclaimer.

(21) Appl. No.: 14/363,286

(22) PCT Filed: Dec. 30, 2011

(86) PCT No.: PCT/CN2011/085065
§ 371 (c)(1),
(2), (4) Date: Nov. 3, 2014

(87) PCT Pub. No.: WO2013/016941
PCT Pub. Date: Feb. 7, 2013

(65) Prior Publication Data
US 2015/0079802 A1    Mar. 19, 2015

(30) Foreign Application Priority Data

Jul. 29, 2011 (CN) .......................... 2011 1 0215819
Nov. 1, 2011 (CN) .......................... 2011 1 0340296

(51) Int. Cl.
*H01L 21/67* (2006.01)
*H01L 21/02* (2006.01)
*H01L 21/306* (2006.01)

(52) U.S. Cl.
CPC .... *H01L 21/6719* (2013.01); *H01L 21/02052* (2013.01); *H01L 21/30604* (2013.01); *H01L 21/6708* (2013.01); *H01L 21/67023* (2013.01)

(58) Field of Classification Search
USPC .................. 156/345.18, 345.15; 134/155, 18
See application file for complete search history.

(56) References Cited

U.S. PATENT DOCUMENTS 5,191,993 A * 3/1993 Wanger ................ B65D 90/008
220/211
7,255,114 B2 * 8/2007 Wen ........................ B01D 11/02
134/103.2
(Continued)

FOREIGN PATENT DOCUMENTS

CN    WO199714178 A1   4/1997
CN         1222429 A    7/1999
(Continued)

OTHER PUBLICATIONS

International Search Report on PCT/CN2011085065, dated May 3, 2012.*
(Continued)

*Primary Examiner* — Sylvia MacArthur
(74) *Attorney, Agent, or Firm* — Han IP PLLC; Andy M. Han

(57) ABSTRACT

Disclosed is an adjustable semiconductor processing apparatus and a control method thereof. The apparatus comprises a micro chamber with an upper chamber portion defining an upper working surface and a lower chamber portion defining a lower working surface that are relatively moveable towards each other between an open position and a closed position. When the chamber is in the closed position, a cavity formed by the upper working surface and the lower working surface defines a gap between the upper working surface, the lower working surface and a semiconductor wafer received in the cavity for flow of a processing fluid. A drive device enables the upper working surface of the upper chamber portion or/and the lower working surface of (Continued)

the lower chamber portion to tilt or deform to control flow of chemical agents within the micro chamber.

9 Claims, 6 Drawing Sheets

(56) References Cited

U.S. PATENT DOCUMENTS

| | | | | |
|---|---|---|---|---|
| 7,874,260 | B2* | 1/2011 | Armanini | C23C 18/1619 |
| | | | | 118/423 |
| 9,016,289 | B2* | 4/2015 | Kahlon | H01L 21/6715 |
| | | | | 134/82 |
| 9,624,575 | B2* | 4/2017 | Lee | H01L 51/001 |
| 2004/0253747 | A1* | 12/2004 | Wen | 438/14 |
| 2005/0034660 | A1* | 2/2005 | Hillman | H01L 21/67126 |
| | | | | 118/715 |
| 2005/0199503 | A1* | 9/2005 | Woodruff | C25D 17/16 |
| | | | | 205/137 |
| 2007/0256710 | A1* | 11/2007 | Wen et al. | 134/22.1 |
| 2008/0179297 | A1* | 7/2008 | Bailey | H01J 37/32366 |
| | | | | 219/69.15 |
| 2011/0041769 | A1* | 2/2011 | Lee | C23C 16/44 |
| | | | | 118/733 |
| 2011/0053376 | A1 | 3/2011 | Jin et al. | |
| 2013/0014700 | A1* | 1/2013 | Hegde | C23C 14/3464 |
| | | | | 118/723 R |
| 2014/0034238 | A1* | 2/2014 | Wen | H01L 21/6719 |
| | | | | 156/345.1 |
| 2015/0079802 | A1* | 3/2015 | Wen | 438/745 |

FOREIGN PATENT DOCUMENTS

| | | |
|---|---|---|
| CN | 1121057 C | 9/2003 |
| CN | 1806312 A | 7/2006 |
| JP | 2001267279 A | 9/2001 |
| WO | WO 9714178 A1 * | 4/1997 |

OTHER PUBLICATIONS

Written Opinion of the International Search Authority on PCT/CN2011085065, dated May 3, 2012.*

* cited by examiner

ADJUSTABLE SEMICONDUCTOR PROCESSING DEVICE AND CONTROL METHOD THEREOF

CROSS REFERENCE TO RELATED APPLICATIONS

This application is the U.S. national phase application of International application number PCT/CN2011/085065, filed on 30 Dec. 2011, which claims the priority benefit of China Patent Applications No. 201110215819.6 and No. 201110340296.8, filed on 29 Jul. 2011 and 1 Nov. 2011, respectively. The above-identified applications are hereby incorporated by reference in their entirety.

TECHNICAL FIELD

The present disclosure relates to the field of surface processing on semiconductor wafers or similar workpieces and, in particular, to an apparatus for chemically processing semiconductor wafer surfaces, as well as for cleaning, etching and other processing.

BACKGROUND

Wafers are used as the carrier for producing integrated circuits. In actual production, a prepared wafer needs to have an ultra-clean, flat surface. Present methods of preparing the ultra-clean surface can be divided into two categories: wet processes such as immersion and spray techniques and dry processes such as chemical vapor and plasma based techniques. The wet processes are relatively extensive methods, which typically consist of a series of steps of immersing or spraying the wafers with appropriate chemical solutions.

The prior art provides an apparatus that employs wet processing to perform ultra-cleaning treatment for wafers. The apparatus comprises a micro chamber that is capable of tightly receiving and processing a semiconductor wafer. The micro chamber may be opened for loading and removing the semiconductor wafer and then closed for processing the wafer. In the process, chemical agents and other fluids are introduced into the micro chamber. The opening and closing of the micro chamber is implemented by a relative shift of the upper and lower chamber inner walls forming the micro chamber along the perpendicular direction, wherein the relative shift is due to driving of two drives in the apparatus.

In practical use, it is found that, in some cases chemical agents need to flow in a gap between the micro chamber and the processed semiconductor wafer in a predetermined manner. For example, the chemical agents flow from one side of the chamber inner wall to the other. Still for example, the chemical agents flow along an annular flow within the chamber. In the prior art, the method is to control chemical agents to enter an inlet position of the micro chamber and exit from an outlet position of the micro chamber, and the method simultaneously uses gases that flow into the micro chamber as a carrier during flowing of the chemical agents such that the chemical agents flow in the predetermined manner. However, this method cannot fully satisfy user requirements. In addition, in the semiconductor processing apparatuses in the prior art, the chemical agents under discharge processing or experiencing the discharge process mainly depend on a pressure change within the chamber. In some instances, the collection effect of the chemical agents may be further simplified.

Accordingly, the present disclosure provides another semiconductor processing apparatus that is capable of controlling flow of chemical agents within a micro chamber for better and completely meeting user requirements.

SUMMARY

One objective of the present disclosure is to provide a semiconductor processing apparatus and a control method thereof, which may control flow of chemical agents within a micro chamber via tilt or deformation of working surfaces of an upper chamber portion and/or a lower chamber portion actuated by a drive device.

To achieve the above objective, in one aspect, the present disclosure provides a semiconductor processing apparatus comprising a micro chamber configured to receive and process a semiconductor wafer. The chamber comprises an upper chamber portion defining an upper working surface and a lower chamber portion defining a lower working surface that are relatively moveable towards each other between an open position and a closed position. When the micro chamber is in the closed position, the semiconductor wafer is disposed within a cavity formed by the upper working surface and the lower working surface and a narrow gap is formed among the upper working surface, the lower working surface, and the semiconductor wafer for flowing of processing fluids. The chamber further comprises at least one inlet for directing the processing fluids into the chamber and at least one outlet for directing processing fluids away from the chamber. An upper part of the upper chamber portion is connected to the drive device or a lower part of the lower chamber portion is connected to the drive device. The drive device comprises a plurality of drive units for driving different positions of the corresponding chambers.

Furthermore, both the upper chamber portion and the lower chamber portion are made of a rigid inelastic material, and the upper chamber portion or/and the lower chamber portion integrally tilt under driving of the drive units, such that the upper working surface of the upper chamber portion or/and the lower working surface of the lower chamber portion integrally tilt.

Furthermore, the upper chamber portion or the lower chamber portion further comprises a thin elastic substrate, with one surface of the thin elastic substrate forming the upper working surface or the lower working surface and the thin elastic substrate abutting against the plurality of drive units. Driving of the drive units enables the gap between the corresponding area of the upper working surface or the corresponding area of the lower working surface and the semiconductor wafer to change.

To achieve the above objective, in another aspect, the present disclosure provides a control method of the semiconductor processing apparatus. The method comprises the steps of: driving the two chambers in an open position; loading the semiconductor wafer onto the lower working surface; driving the two chambers to be in a closed position; injecting processing fluids into the inlet of the cavity such that the processing fluids flow along the gap and removing the processing fluids away from the outlet of the cavity; and controlling, according to a predetermined strategy, the drive units such that a gap between the corresponding area of the upper working surface or the lower working surface and the semiconductor wafer changes, or the upper working surface or/and the lower working surface integrally cause a predetermined tilt.

Compared with the prior art, the semiconductor processing apparatus in the present disclosure employs a plurality of drive units that are arranged on outer sides of the upper chamber portion and/or the lower chamber portion to provide driving forces for the upper chamber portion or the lower chamber portion at different times and at different positions. In this way, the upper working surface or lower working surface causes a predetermined tilt or deformation to control flow of the interior chemical agents, for example, to control flow of chemical agents along the same direction or an annular flow on the upper working surface or lower working surface. In addition, according to the present disclosure, the tilt or deformation of the upper working surface or lower working surface may be caused to facilitate collection of discharge liquids during the processing or after the processing.

BRIEF DESCRIPTION OF THE DRAWINGS

The present disclosure may be better understood in conjunction with the reference drawings and the following detailed description, wherein like numeral references denote like parts. Among the drawings.

DETAILED DESCRIPTION OF THE PREFERRED EMBODIMENTS

To make the objectives, features, and advantages of the present disclosure clearer, the present disclosure is further described in detail with reference to the drawings and illustrative embodiments.

For ease of description, a micro chamber that acts as one of key components of a semiconductor processing apparatus is firstly described, wherein the micro chamber is configured to receive and process a semiconductor wafer.

Figure 1:
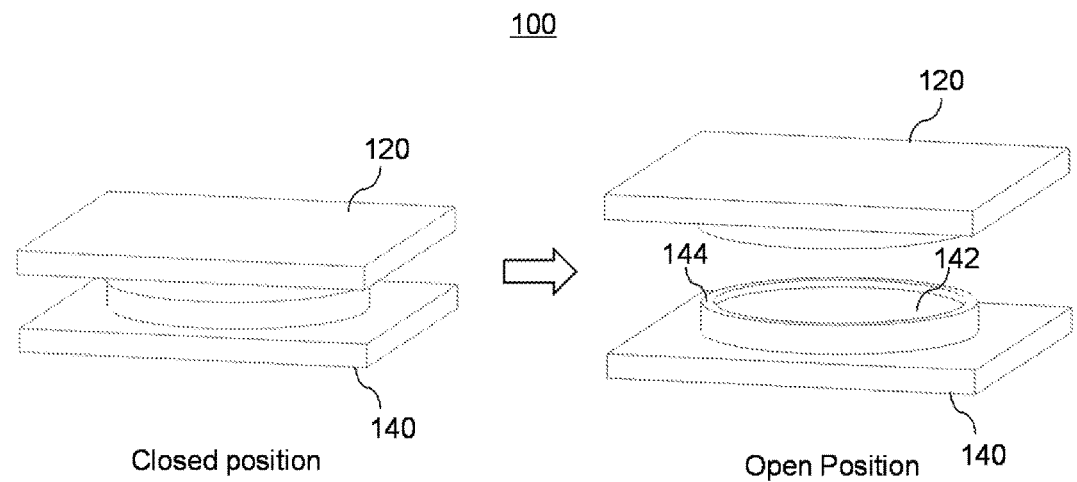
FIG. 1 is a perspective view of the micro chamber according to an embodiment of the present disclosure.

Referring to FIG. 1, a perspective view of a micro chamber 100 according to an embodiment of the present disclosure is illustrated. The micro chamber 100 comprises an upper chamber portion 120 defining an upper working surface and an upper perimeter portion, and a lower chamber portion 140 defining a lower working surface 142 and a lower perimeter portion 144. The upper working surface, the upper perimeter portion, the lower working surface 142, and the lower perimeter portion 144 enclose to form a cavity configured to receive and process the semiconductor wafer. The upper chamber portion 120 and the lower chamber portion 140 are moveable between a closed position and an open position via mechanical structures such as perforative columns, slide rails or open structures. In the open position, the upper chamber portion 120 is separate from the lower chamber portion 140, for loading and removing the semiconductor wafer which is to be processed or has been processed within the cavity. In the closed position, the upper chamber portion 120 closely abuts against the lower chamber portion 140 such that a cavity is formed by enclosing of the upper working surface, the upper perimeter portion, the lower working surface 142, and the lower perimeter portion 144. When the semiconductor wafer is loaded into the cavity and the cavity is in the closed position, chemical agents, mixtures and other fluids can be introduced into the cavity for analyzing, cleaning, etching and other processing of the semiconductor wafer therewithin. During the processing and after the processing, the chemical agents and other fluids may be directed out of the cavity.

In particular, the processed semiconductor wafer is received in the cavity formed by the upper working surface, the upper perimeter portion, the lower working surface 142, and the lower perimeter portion 144. The opposing surfaces of the upper perimeter portion and the lower perimeter portion 144 may also be connected via an elastic O-shaped ring. That is, an elastic O-shaped ring may be clamped between the jointed surfaces of the upper perimeter portion and the lower perimeter portion 144. The elastic O-shaped ring is usually made of a soft elastic material such as rubber such that the micro chamber achieves a better sealing effect. In addition, it should be noted that predetermined gaps are preferably arranged between the semiconductor wafer, the upper working surface, and the lower working surface. In one embodiment, a predetermined width of the gaps is generally within the range of 0.01 mm-10 mm. The width and shape of the gaps may be changed by adjusting the abutting tightness of the upper chamber portion 120 and the lower chamber portion 140 and by causing a slight tilt on the upper working surface and the lower working surface. As the gaps change, different flow patterns of the processing fluids within the chamber may be achieved. As one of the key points and difficulties in the present disclosure, an upper part of the upper chamber portion 120 is provided with an upper drive device. Additionally or alternatively, a lower part of the lower chamber portion 140 is provided with a lower drive device. At least the upper or lower drive device comprises a plurality of drive units which are capable of driving different positions of the relative chamber. The drive device provides a driving force for partial positions of the upper chamber portion 120 or/and the lower chamber portion 140 at different times and at different positions, leading to a predetermined tilt of the upper working surface or the lower working surface to control flow of the processing fluids such as chemical agents and mixtures thereof. In one embodiment, both the upper chamber portion 120 and the lower chamber portion 140 are made of a rigid inelastic material. The upper chamber portion 120 or/and the lower chamber portion 140 tilt completely under driving of the drive units, thereby causing a relative tilt of the whole upper working surface of upper chamber portion 120 or/and the whole lower working surface of lower chamber portion 140.

Figure 2:
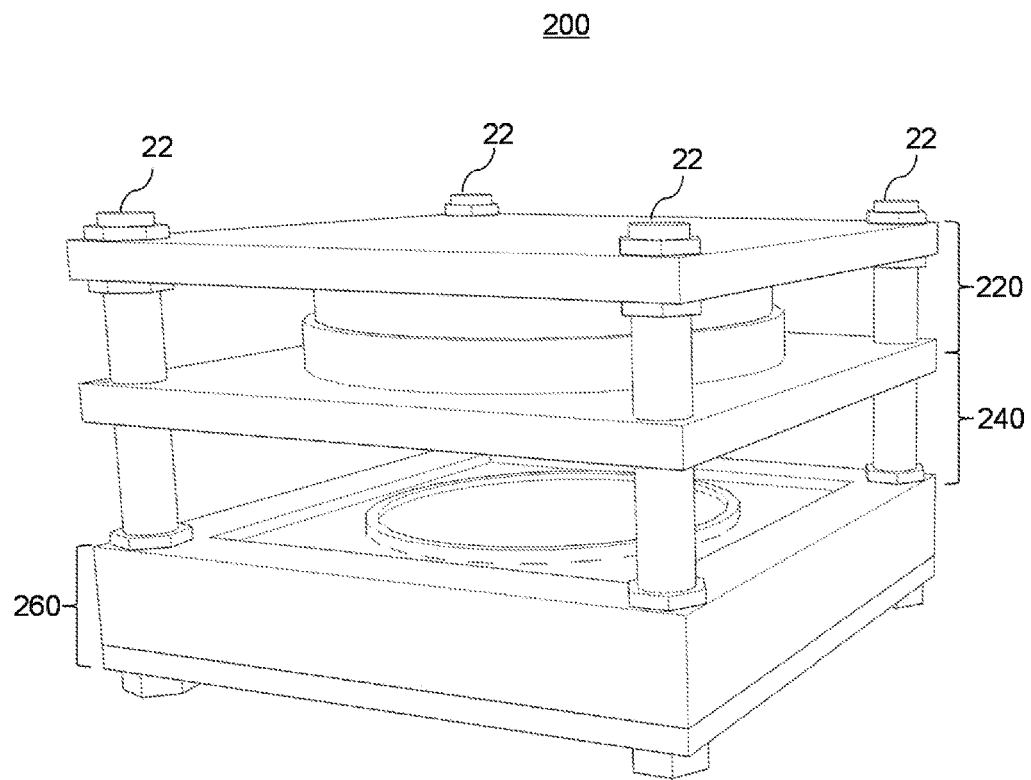
FIG. 2 is an assembly drawing of the semiconductor processing apparatus according to an embodiment of the present disclosure.
Figure 3:
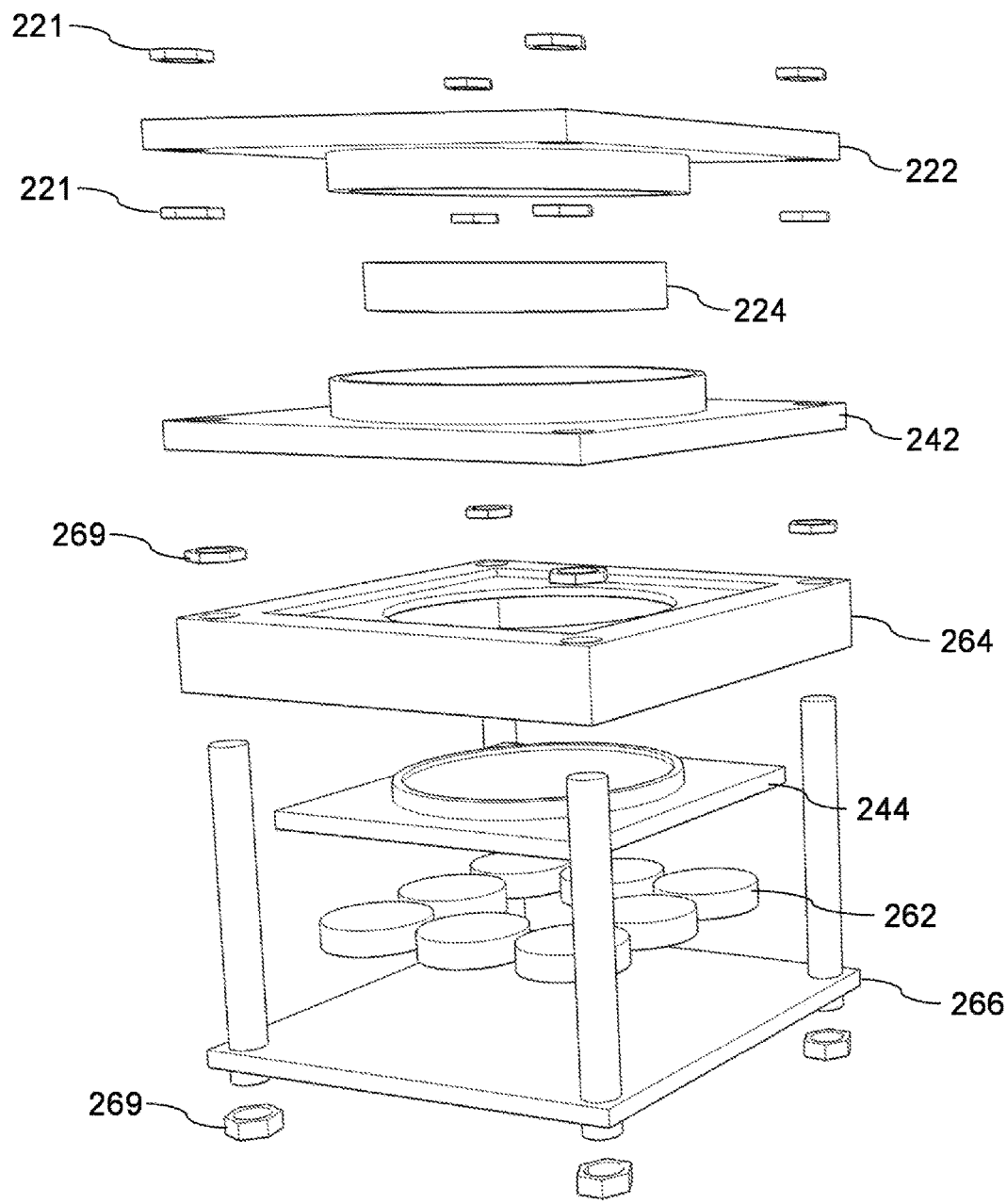
FIG. 3 is an exploded view of the semiconductor processing apparatus according to an embodiment of the present disclosure.

Accordingly, referring to FIGS. 2 and 3, a schematic assembly view and an exploded view of a semiconductor processing apparatus 200 according to an embodiment of the present disclosure is illustrated. Briefly, the semiconductor processing apparatus 200 comprises an upper drive device 220, a micro chamber module 240, and a lower box device 260. The components of the modules or devices are supported, fixed or guided by four columns 22 which are parallel to each other. Partial outer surfaces of the columns 22 are machined with screw threads. Along the columns 22, there are sequentially provided the upper drive device 220, the micro chamber module 240, and the lower box device 260 from top to bottom. The micro chamber module 240 comprises a micro chamber configured to process semiconductor wafer. The micro chamber comprises an upper chamber plate 242 (or an upper chamber portion) defining an upper working surface, and a lower chamber plate 244 (or a lower chamber portion) defining a lower working surface. The upper chamber plate 242 is supported and driven by the upper drive device 220, and the lower chamber plate 244 is supported and driven by the lower box device 260. The lower box device 260 comprises a cubic lower box top cover 264 with a larger upward opening. The lower chamber plate 244 is held and supported in the cubic cavity, and the lower working surface is exposed upwardly via the opening. Between the bottom of the lower chamber plate 244 and the footwall of the cubic lower box top cover 264, there are provided a plurality of drive units corresponding to different positions of the bottom surface of the lower chamber plate 244. These drive units may be referred to as the lower drive device.

The upper drive device 220 can drive the upper chamber plate 242 to move along the columns 22 to shift relative to the lower chamber plate 244 such that the upper chamber plate 242 and the lower chamber plate 244 are in the open or closed position when the semiconductor wafer needs to be loaded or removed. The plurality of drive units may be, for example, fluid drives, air bags or hydraulic drives. The drive units are dispersedly connected to the partial positions beneath the lower chamber portion. For example, the drive units 262 may be dispersedly or evenly arranged along the rim at the joint of bottom walls and side walls of the cubic cavity. Control of expansion and contraction of one or more of the plurality of drive units results in the predetermined tilt of the lower working surface defined by the lower chamber plate 244.

For description of the present disclosure, the upper drive device 220 and the upper chamber plate 242 are described first. From top to bottom, the upper drive device 220 sequentially comprises a top cover 222, an air bag 224 (or a drive unit) and a part of the upper chamber plate 242. The air bag 224 is positioned within the cavity formed between the top cover 222 and the upper chamber plate 242, and is fixed to the top cover 222 and the upper chamber plate 242. When the air bag 242 is filled with air, the upper chamber plate 242 can move downward under the guidance of the columns 22, thereby achieving a transformation of the micro chamber from the open position to the closed position. When the air in the air bag is let out, the upper chamber plate 242 can move upwardly under the guidance of the columns 22, thereby achieving a transformation of the micro chamber from the closed position to the open position.

Figure 4:
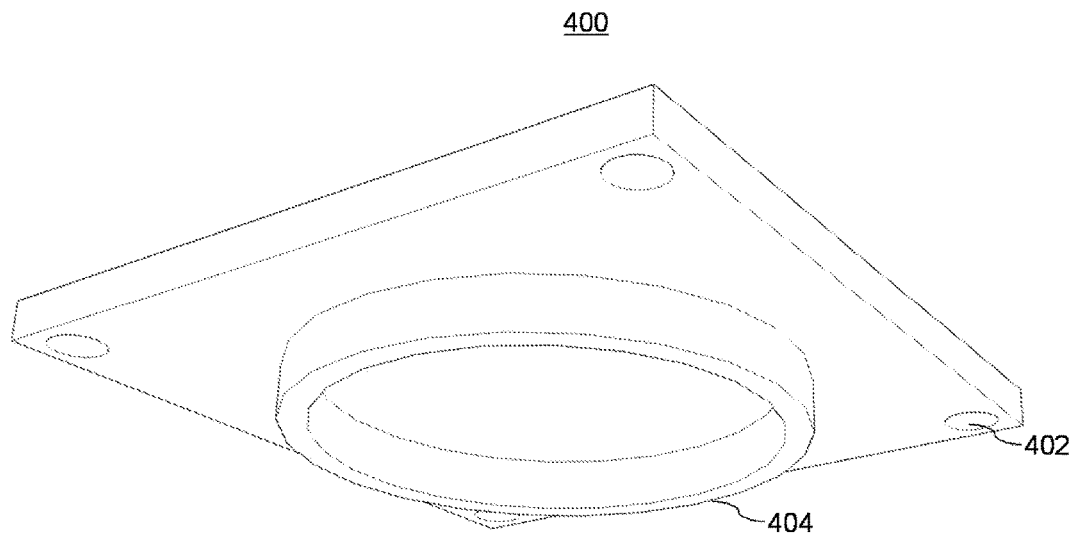
FIG. 4 is a bottom view of the top cover plate according to an embodiment of the present disclosure.

FIG. 4 is a bottom view of a top cover plate 400 according to an embodiment of the present disclosure. The top cover plate 400 is square shaped and the four corners of the top cover plate 400 comprise four column holes 402 corresponding to the columns 22, which are fastened with the tops of the columns 22 by eight first nuts 221 mating with the screw threads machined on the tops of the columns 22. One downward-facing surface of the cover plate 400 also extends to form a cylindrical first side wall 404. The first side wall 404 is configured to form a part of the chamber wall for a cavity for receiving the air bag 224.

Figure 5:
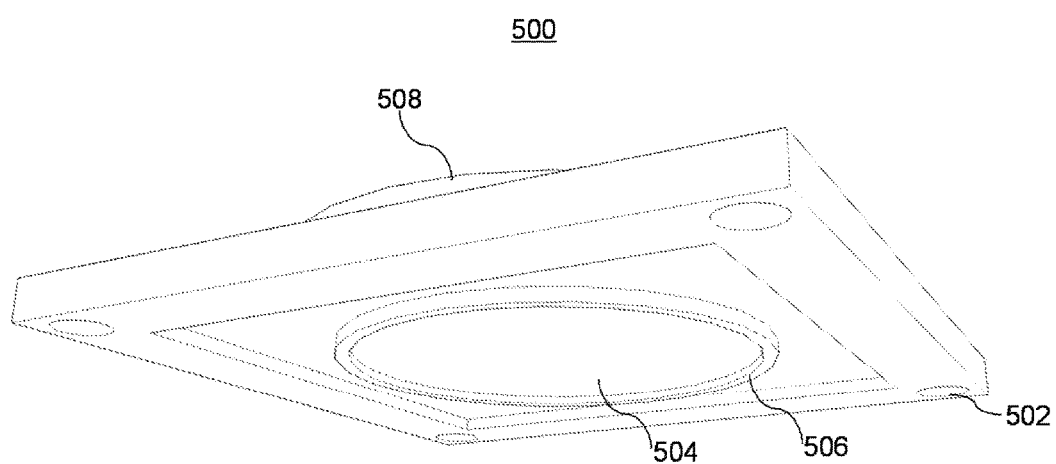
FIG. 5 is a perspective view of the upper chamber plate according to an embodiment of the present disclosure.

FIG. 5 is a perspective view of an upper chamber plate 500 according to an embodiment of the present disclosure. The upper chamber plate 500 is also square shaped and the four corners of the upper chamber plate 500 comprise four column holes 502 corresponding to the columns 22. The inner diameter of the four column holes 502 is slightly larger than the outer diameter of the columns 22, and the upper chamber plate 500 may slide up and down under the guidance of the columns 22. One downward-facing surface of the upper chamber plate 500 extends downward to form a first circular bulge, and one downward-facing surface of the first circular bulge forms an upper working surface 504. The perimeter around the first circular bulge also extends downward to from a convex upper perimeter portion 506. The upward side of the upper chamber plate 500 extends upwardly to form a cylindrical second side wall 508. The inner diameter of the second side wall 508 is not smaller than the outer diameter of the first side wall 404 such that the first side wall 404 may be sleeved within the second side wall 508, forming a retractable cavity for receive the air bag 224 in conjunction with the top cover plate 222 and the partial surface of the upper chamber plate 242. Similarly, the outer diameter of the second side wall 508 may be slightly smaller than the inner diameter of the first side wall 404 such that the first side wall 404 may be sleeved within the second side wall 508, forming the retractable cavity for receiving the air bag 224 in conjunction with the top cover plate 222 and the partial surface of the upper chamber plate 242. The air bag 224 may be fixed to the surface of the top cover plate 222 and upper chamber plate 242 by using screws, glues or other known components. Using the above structure, when the air bag 224 expands, the upper chamber plate 242 can move downward under the guidance of the columns 22. When the air bag 224 contracts, the upper chamber plate 242 can move upward under the guidance of the columns 22.

The following will continue to describe the lower box device 260, lower chamber plate 244 taken in the lower box device 260 and a plurality of drive units 262. The lower box device 260 comprises the top cover 264 of the lower box with a larger upward opening and the lower box bottom cover 266. The lower chamber plate 244 and the plurality of drive units 262 are clamped in the cubic cavity between the lower box top cover 264 and the lower box bottom cover 266 of the lower box. The lower box top cover 264 and the lower box bottom cover 266 may be fixed to the columns 22 by using eight second nuts 269 mating with the screw threads machined at the middle and bottom of the columns 22. The drive units 262 may be fluid drives, for example, air bags or hydraulic drives. The drive units are dispersedly connected to the partial positions beneath the lower chamber portion. For example, the drive units 262 may be dispersedly or evenly arranged along a rim at the joint of the bottom wall and the side wall of the cubic cavity. Control of expansion and contraction of one or multiple drive unit 262 results in a predetermined tilt of the lower working surface defined by the lower chamber plate 244.

Figure 6:
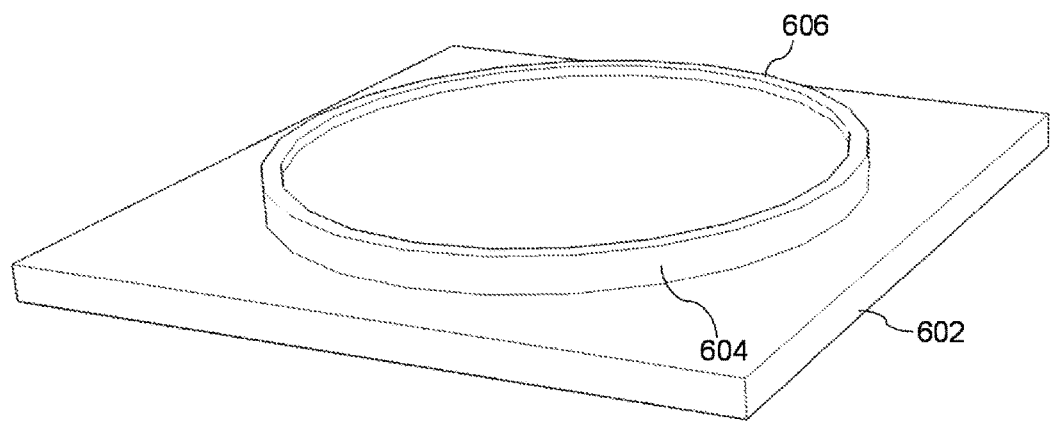
FIG. 6 is a perspective view of the lower chamber plate according to an embodiment of the present disclosure.

Referring to FIG. 6, a perspective view of a lower chamber plate 600 in an embodiment of the present disclosure is illustrated. The lower chamber plate 600 comprises a rectangular substrate portion 602 and a second circular bulge 604 extended upwardly from the rectangular substrate section 602. The upper side of the second circular bulge 604 defines the lower working surface. The edge around the second circular bulge 604 further extends upward to form a flange-type lower perimeter portion 606. The shape of second circular bulge 604 is basically in accord with that of the first circular bulge 504. The joint surface of the upper perimeter portion 506 and the lower perimeter portion 606 further form a circular groove for arranging the elastic O-shaped ring that is made of such a material as rubber (not shown). In addition, the elastic O-shaped ring may improve shut tightness between the upper chamber plate and the lower chamber plate in the closed position. When the upper chamber plate and the lower chamber plate are in the closed position, the gap formed therebetween with a predetermined width enables the upper chamber plate or the lower chamber plate to move or tilt to some extent without affecting the air tightness of the chamber.

Figure 7:
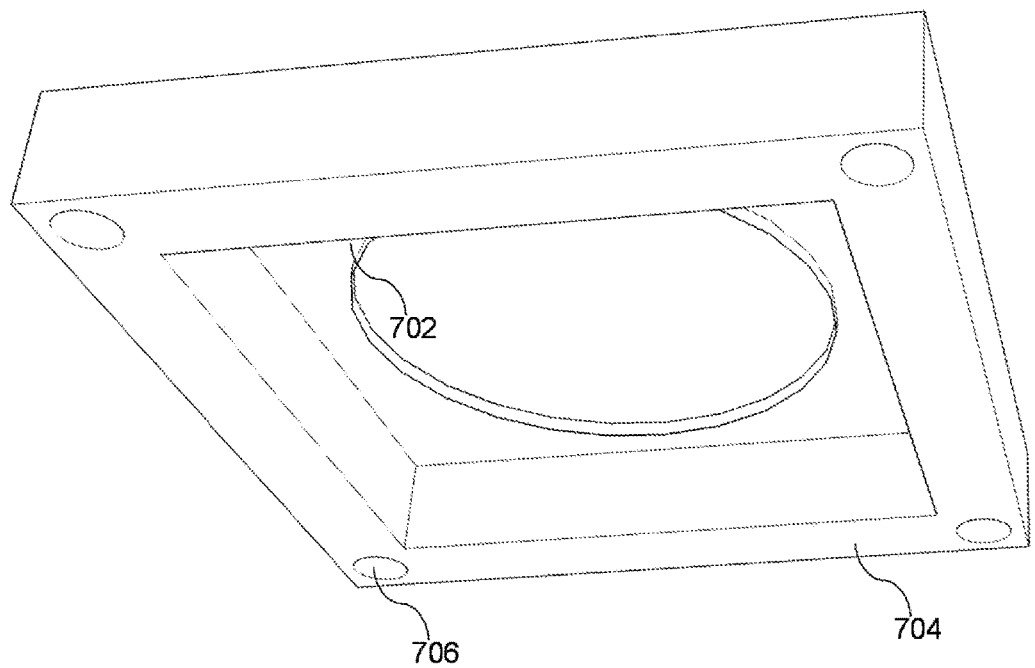
FIG. 7 is a perspective view of the lower box cover plate according to an embodiment of the present disclosure.

Still referring to FIG. 7, a perspective view of a lower box cover plate 700 according to an embodiment of the present disclosure is illustrated. The lower box cover plate 700 comprises a square top plate 702 with a larger opening and four side plates 704 extended downward from the four sides of the square top plate 702. The four corners of the top plate 702 also comprise four column holes 706 corresponding to the columns 22. In one embodiment, the side plates 704 are thicker and the four column holes 704 may run through the side plates 704 longitudinally. The large opening in the square top plate 702 corresponds to the shape of the second circular bulge 604, and the outer size of the second circular bulge 604 is slightly smaller than that of the large opening in the square top plate 702 such that when the lower chamber plate 244 is received in the lower box device 260, the second circular bulge 604 may run through the large opening and may be exposed above the lower box device 260. Moreover, a gap is formed between the second circular bulge 604 and the large opening such that the lower chamber plate 244 may be subject to such movement as tilt relative to the lower box cover plate 264. Correspondingly, the lower box bottom plate 266 is a square plate with four corners comprising four column holes. The whole shape of the lower box bottom plate 266 is basically symmetric to the square top plate of the lower box cover plate 700, between which the difference includes that the center of the lower box bottom plate 266 is provided with no opening. When the lower box cover plate 264 and the lower box bottom plate 266 are stacked, a cubic cavity is formed in the interior. The lower box cover plate 264 and the lower box bottom plate 266 may be fixed to the columns 22 by using eight second nuts 269 mating with screw threads machined at the middle and bottom of the columns 22. The lower chamber plate 244 and the plurality of drive units 262 are clamped between the lower box top cover 264 and lower box bottom cover 266. The joint surface between the lower box top cover 264 and the lower box bottom cover 266 may also hold elastic plates.

During normal operation, the lower chamber plate 244 is supported and squeezed by the plurality of drive units, and thus is received in the cavity between the lower box top cover 264 and the lower box bottom cover 266. The lower working surface of the lower chamber plate 244 is exposed above the lower box top cover 264 and turns out to be horizontal. When the upper chamber plate 242 and the lower chamber plate 244 are in closed position, the lower working surface defined by the lower chamber plate 244 causes a predetermined tilt by controlling the expansion and contraction of one or the plurality of drive units 262. Though the tilt range is not very sharp, with respect to the micro gap between the lower working surface and the semiconductor wafer, the chemical agents between the lower working surface and the semiconductor wafer may run along the lower position or the big gap due to the tile of the lower working surface and the change of the gap. Predictably, if, within a period of time, different drive units 262 employ different drive modes, such that the tilt of the lower working surface is dynamically controllable, predetermined effects that the chemical agents between the lower working surface and the semiconductor wafer generate circulation or flow in a fixed direction according to the predetermined effects may be accordingly achieved.

In the embodiment illustrated in FIG. 2, one air bag 244 is provided in the upper drive device 220. In another embodiment, a plurality of air bags 244 may be provided. That is to say, the upper drive device 220 may also comprise a plurality of drive units corresponding to different positions of the top surface of the upper chamber plate. Furthermore, the upper drive device 220 may not be arranged but the upper chamber plate 242 is directly fixed. In summary, the upper part of the upper chamber plate 242 may be arranged with an upper drive device and, alternatively or additionally, the lower part of the lower chamber plate 244 may be arranged with a lower drive device. At least one of the upper or lower drive device comprises a plurality of drive units capable of driving different positions of the relative chambers to control the movement on the working surface of the chamber plate.

In one embodiment, the semiconductor processing apparatus also comprises control units. The control unit can control one or more of the plurality of drive units by programming such that the drive units drive the upper chamber portion or the lower chamber portion to cause a predetermined tilt or other movement according to a program strategy formulated by a user. In another embodiment, the drive units may be dispersedly connected to the partial positions above upper chamber portion or beneath lower chamber portion such that the upper chamber portion or the lower chamber portion may cause a predetermined tilt towards each direction under the driving forces of different sizes and at different positions. In still another embodiment, a quantity of the drive units may be four or eight, and the drive units may be evenly be arranged at the positions above the upper chamber portion or beneath the lower chamber portion and near the edge of the chamber, to facilitate the control by the control units. Accordingly, the user may program the control of the drive units by using control units. For example, in a specific embodiment, the control units may control one of two drive units arranged symmetrically to expand gradually for raising one side of the lower chamber portion. Then, in neighboring subsequent period of time, the control units control the expanded drive unit to contract gradually, and the other drive unit expands gradually to lower one side of the lower chamber portion that has been raised while rasing the corresponding other side of the lower chamber portion. In this way, by repeating these steps, the lower chamber portion causes regular movements similar to pendulums such that the chemical agents in the micro chamber flow back and forth in two opposing directions. In yet still another embodiment, a quantity of eight of drive units numbering from one to eight are arranged below the lower chamber portion, and the drive units are evenly disposed around the rim of the surface below the lower chamber portion. In the sequence from one to eight and then in the reverse sequency from eight to one, the control units circularly control neighboring drive units to sequentially expand for a predetermined time length, resulting in the circular undulations of the lower chamber portion such that the chemical agents in the micro chamber circularly flow clockwise or counterclockwise. Though the above embodiment mainly describes the present disclosure in the way that a plurality of drive units are arranged beneath the lower chamber portion, in other embodiments in which a plurality of drive units are arranged above the lower chamber portion may be envisaged by a person skilled in the art.

Still referring to FIG. 1, in another embodiment, a plurality of drive units may also be arranged within the interiors of the upper chamber portion 120 and the lower chamber portion 140 to provide driving forces for the upper working surface or the lower working surface at different times and at different positions, such that the corresponding areas of the upper working surface or the lower working surface are subject to deformation, i.e., the gap width for processing fluids flowing in the partial area changes, thereby enabling the processing fluids to flow according to predetermined patterns.

Figure 8:
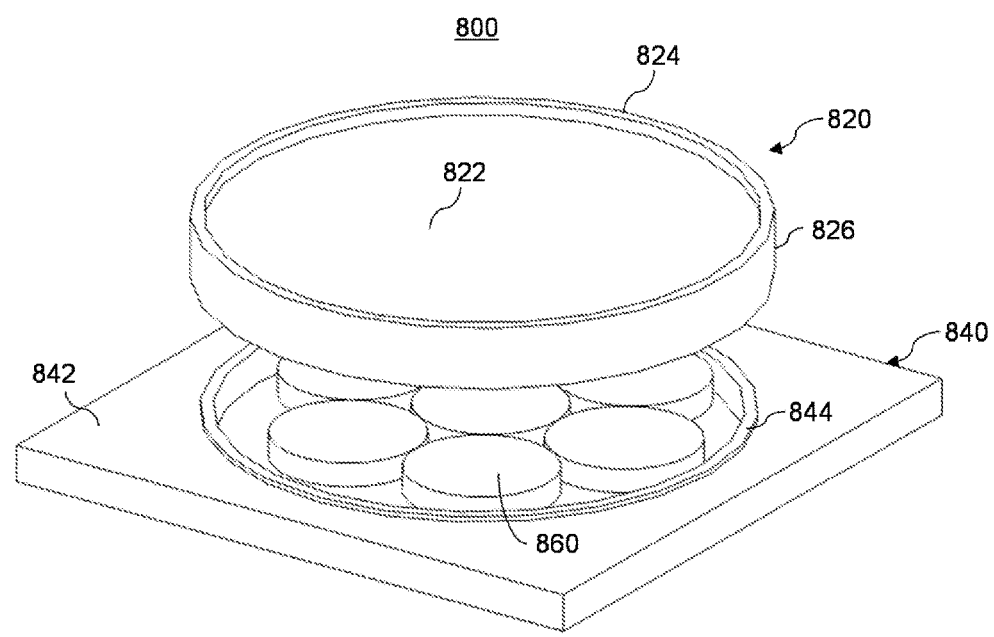
FIG. 8 is a perspective view of the upper chamber portion of FIG. 1 according to an embodiment of the present disclosure.

FIG. 8 is a perspective view of an upper chamber portion 800 (which is the upper chamber portion 120 as illustrated in FIG. 1) according to an embodiment of the present disclosure. The upper chamber portion 800 comprises an upper chamber portion inner wall 820, an upper box body 840, and a plurality of fluid drive units 860 clamped between the upper chamber portion inner wall 820 and the upper box body 840.

The upper chamber portion inner wall 820 comprises an elastic thin circular substrate. One side of the elastic thin substrate defines the upper working surface. The rim of the elastic thin substrate extends to form an upper perimeter portion 824, i.e., the illustrative flange. The other side of elastic thin substrate extends to form a cylindrical upper side wall 826, wherein the inner edge of the upper side wall 826 forms a first screw thread (not shown).

The upper box body 840 comprises a rectangular or square substrate portion 842. One side of the substrate portion 842 extends to form a circular flange 844 corresponding to an upper side wall 826. The outer edge of the circular flange 844 defines a second screw thread mating with the first screw thread (not shown). The upper chamber portion inner wall 820 may be rotatably arranged above the upper box body 840 by using the first screw thread and the second screw thread. In addition, a cavity for receiving a plurality of fluid drive units 860 is arranged between the upper chamber portion inner wall 820 and the upper box body 840.

In one embodiment, the plurality of fluid drive units 860 comprise a first fluid drive unit, a second fluid drive unit, a third fluid drive unit, a forth fluid drive unit, a fifth fluid drive unit, a sixth fluid drive unit, and a seventh fluid drive unit (not shown). The first fluid drive unit is positioned at the center and the remaining units are distributed evenly around the first fluid drive unit. Each of the plurality of fluid drive units 860 is clamped between the elastic thin substrate and the surface of the upper box body 840 relative to the elastic thin substrate. In one embodiment, the fluid drive units may be cylindrical air bags of the same size. The upper surface and the lower surface of the cylindrical air bag are adhered with glues to the surface of the elastic thin substrate and the surface of the upper box body 840 relative to the elastic thin substrate. The upper box body 840 may be made of a thicker alloy material to provide steady sustenance for each of the plurality of fluid drive units. The upper chamber portion inner wall 820 may be made of a heat-resistant and corrosion-resistant plastic material, and the elastic thin substrate defining the upper chamber portion inner wall is thinner and elastic. Predictably, when one fluid drive unit expands, a driving force perpendicular to the upper working surface and pointing to the interior of the micro chamber is provided for the elastic thin substrate and the corresponding area abutting against the elastic thin substrate, thereby forming a hump on the partial area of the elastic thin substrate towards the micro chamber. When one fluid drive unit contracts, a driving force perpendicular to the upper working surface and pointing to the exterior of the micro chamber is provided for the elastic thin substrate and the corresponding area abutting against the elastic thin substrate, thereby forming a hollow on the partial area of the elastic thin substrate towards the micro chamber. The force position of the driving force is related to the linked position of the fluid drive unit and the elastic thin substrate. The magnitude of the driving force is related to the degree of the expansion or contraction of the fluid drive unit. The direction of the driving force is related to the expansion or contraction of the fluid drive unit.

As fluids run into the hump, they would be dispersed. As fluids run into the hollow, they would be converged. If at present the semiconductor wafer is being processed by using chemical agents in the micro chamber, flow of the chemical agents within the micro chamber also changes due to a change of the gap between the upper working surface and the semiconductor wafer. For instance, the first fluid drive unit expands and is maintained at a fixed position, which results in a hump formed at the center of the elastic thin substrate, i.e., the gap between the upper working surface of the relative partial area and the semiconductor wafer becomes smaller and the chemical agents within the micro chamber move from the center to the border around. Still for example, the first fluid drive unit expands and is maintained at a fixed position, which result in a hump formed at the center of the elastic thin substrate and then the second fluid drive unit, the third fluid drive unit, the forth fluid drive unit, the fifth fluid drive unit, the sixth fluid drive unit, and the seventh fluid drive unit sequentially expand. This results in the chemical agents within the micro chamber flowing along the edge of the micro chamber. In other words, when the fluid drive units provide driving forces for the upper working surface at different times and at different positions according to a predetermined strategy, leading to a change of the gap between the upper working surface and the semiconductor wafer, the manner in which chemical agents within the micro chamber flow may be controlled accordingly.

Similarly, the lower chamber portion 140 may be in the same or similar structure as the upper chamber portion 800 illustrated in FIG. 8

Figure 9:
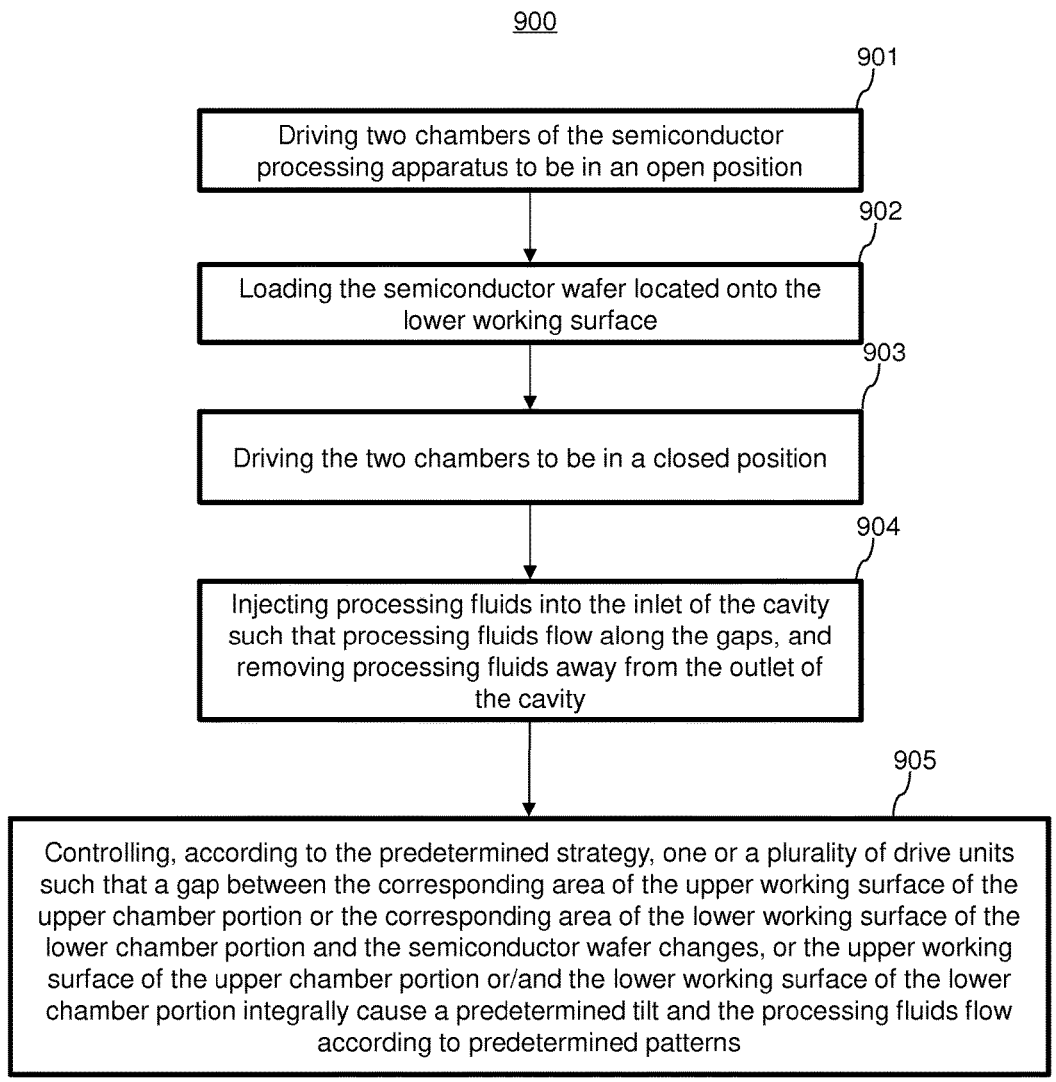
FIG. 9 is a flow diagram of the control method of the semiconductor processing apparatus according to an embodiment of the present disclosure.

Further, the present disclosure provides a control method of the semiconductor processing apparatus. Referring to FIG. 9, a flowchart of a control method 900 of the semiconductor processing apparatus according to an embodiment of the present disclosure is illustrated. The control method 900 of the semiconductor processing apparatus comprises a number of steps described below.

At 901, the method drives either or both of the upper chamber portion and the lower chamber portion of the micro chamber of the semiconductor processing apparatus to place the micro chamber in an open position.

At 902, the method loads a semiconductor wafer onto the lower working surface of the lower chamber portion of the micro chamber.

At 903, the method drives either or both of the upper chamber portion and the lower chamber portion of the micro chamber to place the micro chamber in a closed position.

At 904, the method injects one or more processing fluids into the inlet of the cavity such that the one or more processing fluids flow along the gap, and remove the one or more processing fluids away from the outlet of the cavity.

The processing fluids herein usually refer to chemical agents. For example, if the semiconductor processing apparatus is used for wet chemical etching of thin film copper, the processing fluids may comprise the mixture of hydrogen peroxide, nitric acid and hydrofluoric acid and may also comprise inert gases acting as the carrier of chemical agents. There are at least one inlet and at least one outlet arranged at any different positions of the micro chamber.

At 905, the method controls, according to a predetermined strategy, one or a plurality of drive units such that a gap between the corresponding area of the upper working surface of the upper chamber portion or a gap between the corresponding area of the lower working surface of the lower chamber portion and the semiconductor wafer changes, or the upper working surface of the upper chamber portion or/and the lower working surface of the lower chamber portion integrally cause a predetermined tilt and the processing fluids flow according to predetermined patterns.

To enable the chemical agents to flow according to flow patterns desired by the user, the drive units may be enabled to provide, according to the predetermined strategy, driving forces for the working surface at different times and at different positions, such that the gap between the working surface and the semiconductor wafer changes, thereby achieving an effect that the flow patterns of the chemical agents within the micro chamber are controlled.

In conclusion, the semiconductor processing apparatus in the present disclosure employs a plurality of drive units that are arranged on outer sides of the upper chamber portion and/or the lower chamber portion to provide driving forces for the upper chamber portion and/or the lower chamber portion at different times and at different positions. In this way, a predetermined tilt or deformation of the upper working surface and/or lower working surface is rendered to control flow of the interior chemical agents.

In the specification, terms "multiple" and "a plurality of" indicate "two or more than two", and "and/or" indicates "and" or "or".

The above description has fully illustrated the exemplary embodiments of the present disclosure. It should be noted that any modification made by a person skilled in the art without departing from the principles of the present disclosure shall fall within the scope defined by the claims of the present disclosure. Accordingly, the scope defined by the claims of the present disclosure is not limited to the above-described embodiments.

What is claimed is:

1. A semiconductor processing apparatus, comprising:
   a drive device comprising one or more drive units; and
   a micro chamber configured to receive a semiconductor wafer, the micro chamber comprising:
      an upper chamber portion; and
      a lower chamber portion; relatively moveable towards the upper chamber portion between an open position and a closed position of the micro chamber,
   wherein, when the micro chamber is in the closed position, the micro chamber is configured to receive the semiconductor wafer within a narrow gap formed between an upper working surface of the upper chamber portion and a lower working surface of the lower chamber portion, the lower working surface comprising a thin elastic substrate,
   wherein each of the one or more drive units of the drive device is connected with a respective partial position of the lower chamber portion,
   wherein, when the micro chamber is in the closed position, the one or more drive units are configured to provide forces of different sizes at different positions of the lower working surface to create a deformation of the thin elastic substrate, and
   wherein, when the micro chamber is in the closed position, the deformation of the thin elastic substrate changes over a period of time according to a predetermined strategy so as to control a flow of a processing fluid within the micro chamber for processing the semiconductor wafer.

2. The semiconductor processing apparatus of claim 1, wherein the drive device is a first drive device, wherein the semiconductor processing apparatus further comprises a second drive device comprising one or more drive units, and wherein each of the one or more drive units of the second drive device is connected with a respective partial position of the upper chamber portion.

3. The semiconductor processing apparatus of claim 1, wherein the semiconductor processing apparatus further comprises a lower box device, the lower box device comprising a cubic cavity with an upward opening, wherein the lower chamber portion is received in the cubic cavity, and wherein the lower working surface is exposed upwardly via the upward opening and is clamped between the lower chamber portion and a bottom wall of the cubic cavity together with the one or more drive units.

4. The semiconductor processing apparatus of claim 3, wherein the one or more drive units comprise a plurality of drive units that are evenly distributed along a rim at a joint of the bottom wall and a side wall of the cubic cavity, wherein the plurality of drive units comprise hydraulic drives, and wherein the lower chamber portion is driven by expansion and contraction of at least one of the plurality of drive units to create the deformation of the thin elastic substrate.

5. The semiconductor processing apparatus of claim 1, wherein the one or more drive units are configured to cause a change in a size of a gap between the semiconductor wafer and a corresponding area of the lower working surface of the lower chamber portion, and wherein the thin elastic substrate comprises a first surface and a second surface, the first surface forming the lower working surface, the second surface opposite to the first surface of the thin elastic substrate abutting against the one or more drive units.

6. The semiconductor processing apparatus of claim 1, wherein the lower chamber portion comprises a box body coupled to the thin elastic substrate, and wherein the thin elastic substrate and the box body clamp and accommodate the one or more drive units.

7. The semiconductor processing apparatus of claim 1, wherein the one or more drive units comprise a plurality of drive units, wherein partial areas on the second surface of the thin elastic substrate abut against the plurality of drive units, wherein, when one of the plurality of drive units expands, a driving force perpendicular to the lower working surface and pointing to an interior of the micro chamber is provided for the thin elastic substrate and a corresponding area abutting against the thin elastic substrate, such that a hump is formed on the lower working surface corresponding to one of the partial areas, and wherein, when one of the plurality of drive units contracts, a driving force perpendicular to the lower working surface and pointing to an exterior of the micro chamber is provided for the thin elastic substrate and a corresponding area abutting against the thin elastic substrate, such that a hollow is formed on the lower working surface corresponding to one of the partial areas.

8. The semiconductor processing apparatus of claim 1, wherein the predetermined strategy results in the processing fluid flowing back and forth regularly in two opposing directions within the micro chamber.

9. The semiconductor processing apparatus of claim 1, wherein the one or more drive units comprise a plurality of drive units evenly disposed around a rim of the lower chamber portion, wherein, in creating the deformation, the each of the plurality of drive units sequentially expands for a predetermined time length to cause a circular undulation in the lower chamber portion, and wherein the flow of the processing fluid within the micro chamber comprises a clockwise circular flow or a counterclockwise circular flow.

\* \* \* \* \*